US012019111B2

(12) United States Patent
Crippa et al.

(10) Patent No.: US 12,019,111 B2
(45) Date of Patent: Jun. 25, 2024

(54) MANUFACTURING METHOD OF A MULTI-LAYER FOR A PROBE CARD

(71) Applicant: TECHNOPROBE S.p.A., Cernusco Lombardone (IT)

(72) Inventors: Roberto Crippa, Cernusco Lombardone (IT); Flavio Maggioni, Cernusco Lombardone (IT); Raffaele Vallauri, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 590 days.

(21) Appl. No.: 16/677,581

(22) Filed: Nov. 7, 2019

(65) Prior Publication Data

US 2020/0072873 A1    Mar. 5, 2020

Related U.S. Application Data

(63) Continuation-in-part of application No. PCT/EP2018/061718, filed on May 7, 2018.

(30) Foreign Application Priority Data

May 11, 2017   (IT) .................. 102017000051157

(51) Int. Cl.
*G01R 31/00* (2006.01)
*G01R 1/073* (2006.01)
(Continued)

(52) U.S. Cl.
CPC ........... *G01R 3/00* (2013.01); *G01R 1/07342* (2013.01); *H05K 3/0029* (2013.01); *H05K 3/4061* (2013.01); *H05K 3/4679* (2013.01)

(58) Field of Classification Search
CPC .. G01R 3/00; G01R 1/07342; G01R 1/07378; H05K 3/0029; H05K 3/4061;
(Continued)

(56) References Cited

U.S. PATENT DOCUMENTS 5,639,385 A    6/1997  McCormick
9,244,099 B2 *  1/2016  Duckworth ........ G01R 1/06738
(Continued)

FOREIGN PATENT DOCUMENTS

CN    101164152 A    4/2008
CN    101865937 A    10/2010
(Continued)

*Primary Examiner* — Thang X Le
(74) *Attorney, Agent, or Firm* — Seed IP Law Group LLP

(57) ABSTRACT

A method of manufacturing a multi-layer for a probe card comprises providing first contact pads on an exposed face of a first dielectric layer and second contact pads on an exposed face of a last dielectric layer. Each dielectric layer is laser ablated to realize pass-through structures and the pass-through structures are conductively filled to realize conductive structures. The dielectric layers are superimposed in a way that each conductive structure contacts a corresponding conductive structure of a contiguous dielectric layer in the multi-layer and forms conductive paths electrically connected the first and second contact pads. The second contact pads having a greater distance between its symmetry centers than the first contact pads, the multi-layer thus performing a spatial transformation between the first and second contact pads connected through the connective paths.

20 Claims, 6 Drawing Sheets

(51) Int. Cl.
*G01R 3/00* (2006.01)
*H05K 3/00* (2006.01)
*H05K 3/40* (2006.01)
*H05K 3/46* (2006.01)

(58) Field of Classification Search
CPC .... H05K 3/4679; H05K 1/0268; H05K 1/112; H05K 3/107; H05K 3/1216; H05K 3/4038; H05K 2201/09563; H05K 2203/025; H05K 3/4617; H05K 3/4629; H05K 1/0298
See application file for complete search history.

(56) References Cited

U.S. PATENT DOCUMENTS

| | | | | |
|---|---|---|---|---|
| 2006/0051948 | A1* | 3/2006 | Kim | G01R 1/0483 438/597 |
| 2007/0107933 | A1* | 5/2007 | Yamamoto | H05K 1/113 174/262 |
| 2008/0107863 | A1 | 5/2008 | Ikeda et al. | |
| 2009/0051041 | A1* | 2/2009 | Otsuka | H01L 23/49822 257/774 |
| 2009/0321114 | A1 | 12/2009 | Takahashi et al. | |
| 2010/0219852 | A1* | 9/2010 | Yamada | G01R 1/07371 324/756.03 |
| 2011/0063066 | A1 | 3/2011 | Choi et al. | |
| 2012/0169367 | A1* | 7/2012 | Kuo | G01R 31/2889 324/756.03 |
| 2015/0008951 | A1* | 1/2015 | Otsubo | H05K 1/0268 156/89.12 |
| 2017/0019990 | A1* | 1/2017 | Takemura | H05K 1/0271 |
| 2018/0120353 | A1* | 5/2018 | König | C25D 5/48 |

FOREIGN PATENT DOCUMENTS

| | | |
|---|---|---|
| JP | 2006041333 A | 2/2006 |
| JP | 2008-89461 A | 4/2008 |
| JP | 2010-54323 A | 3/2010 |
| TW | I556702 | 11/2016 |
| TW | I579978 B | 4/2017 |
| WO | WO 03062841 A1 | 7/2003 |

\* cited by examiner

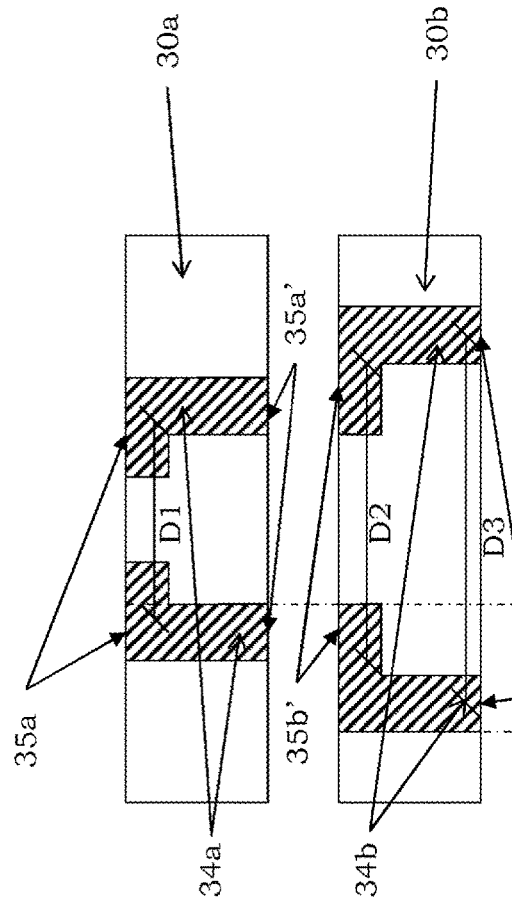
FIG. 4C
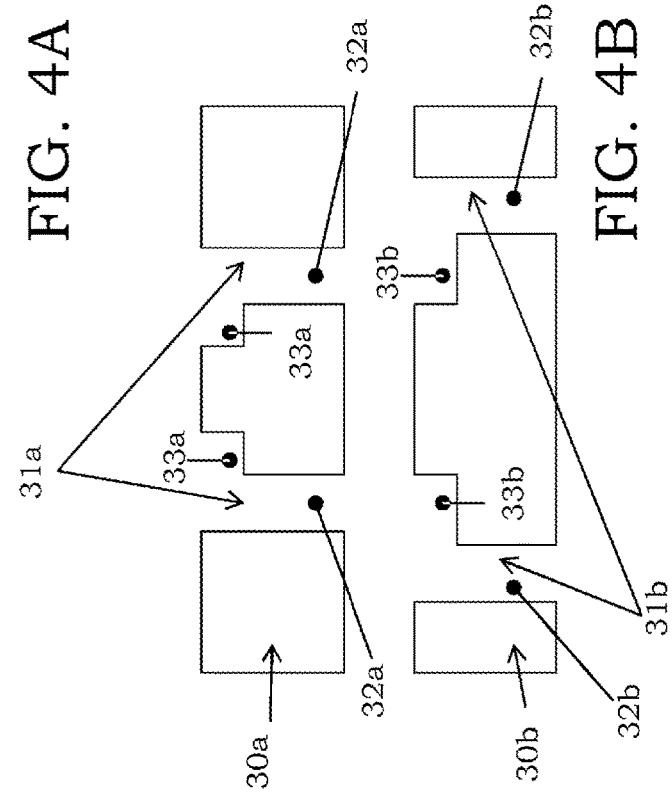
FIG. 4D
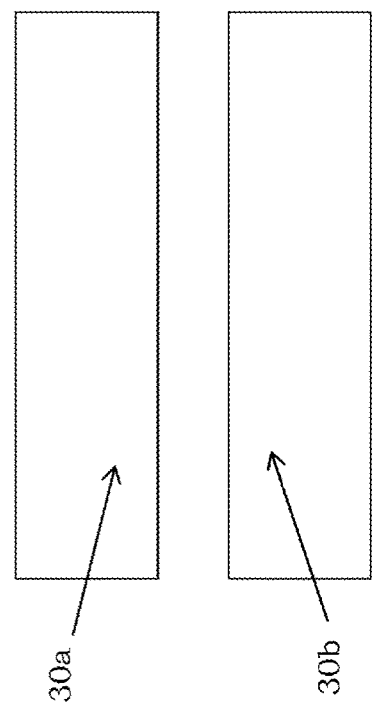
FIG. 4A
FIG. 4B

MANUFACTURING METHOD OF A MULTI-LAYER FOR A PROBE CARD

TECHNICAL FIELD

The present disclosure refers to a manufacturing method of a multi-layer for a probe card.

The disclosure refers in particular, but not exclusively, to a manufacturing method of a multi-layer for a probe card for a testing apparatus of electronic devices integrated on wafer and the following disclosure is made referring to this field of application with the sole aim of simplifying the presentation thereof.

DESCRIPTION OF THE RELATED ART

As it is well known, a probe card is a device adapted to electrically connect a plurality of contact pads of a microstructure, in particular an electronic device that is integrated on wafer, with corresponding channels of a testing apparatus that performs the functionality testing, in particular electric, thereof, or the test, generically.

The test, which is performed on integrated devices, is particularly useful in detecting and isolating defective circuits as early as in the production phase. Normally the probe cards are therefore employed for the electric test of devices that are integrated on wafers before cutting or singulation and assembling them within a chip containment package.

A probe card comprises a probe head including in turn a plurality of mobile contact elements or contact probes provided with at least one portion or a contact tip for a corresponding plurality of contact pads of a device under test. By the terms end or tip, it is hereinafter indicated an end region, not necessarily sharp.

The probe heads referred to as having vertical probes and indicated by the English term "vertical probe head" are well known in the field. A probe head with vertical probes comprises a plurality of contact probes retained by at least one pair of plates or guides, substantially plate-shaped and parallel to each other. Such guides are provided with suitable holes and are placed at a certain distance from each other so as to leave a free space, also known as air gap or bending gap, for the movement and possible deformation of the contact probes. The pair of guides comprises in particular an upper guide and a lower guide, both provided with guide holes within which the contact probes axially slide, which are usually made of wires of special alloys having good electric and mechanical properties.

Generally, probe heads with not fixedly constrained probes, but held interfaced to a board, connected again to the testing apparatus are used: they are referred to as probe heads with non-blocked probes.

In that case, the contact probes also have a contact end or head towards a plurality of contact pads of a wiring board between the device under test and the testing apparatus, generally formed by using the printed circuit techniques, also commonly referred to as PCB board (English acronym: "Printed Circuit Board").

Good electrical connection between probes and PCB board is ensured by the pressure of the probes, particularly of the contact heads thereof, on the contact pads of the PCB board, indeed.

Furthermore, the probe head is usually interfaced to an intermediate multi-layer, commonly referred to as interposer, which performs a spatial transformation of the distances of the contact pads arranged on the opposite faces thereof. In particular, on a first face of the interposer facing the probe head, the contact pads have the same distance as the contact pads of the device under test, whereas the contact pads arranged on a second and opposed face of the interposer have the same distance as the contact pads arranged on the PCB board the interposer connects to.

The phrase "pitch between pads" means hereinafter the distance between the centres of such pads, meant as centres of symmetry thereof, distance commonly referred to as "pitch".

Generally, the pitch between the contact pads of the PCB boards is in the order of 400 µm, whereas the pitch between the contact pads of the device under test is in the order of 60-80 µm.

Indeed, it is known that the PCB technology allows forming cards with active areas, even with large dimension, but with great limitations with respect to a minimum value that can be achieved for the pitch between the contact pads with respect to the pitches obtainable with the integration techniques of the devices under test.

The interposer can be manufactured by means of MLC ceramic-based technology (MLC being acronym of "Multi-Layer Ceramic") or MLO organic-based technology (MLO being acronym of "MultiLayer Organic") and comprises a plurality of layers used to perform the desired spatial transformation by means of pass-through tracks and holes suitably conductive and being in each layer, which electrically connect contact pads on the opposite faces of the interposer. Such technologies are usually used since they allow to obtain very short pitches between contact pads and higher density with respect to PCB technology.

The interposer so manufactured usually comprises a first zone with thinner layers and in a limited amount (generally less than 10), referred to as noble zone, which performs a first spatial transformation having fine pitch, with pitches between the contact pads ranging from 60-80 µm for a first layer (near the probe head) up to about 200 µm for a last layer, and a second zone with thicker layers and in a larger amount, called the core zone, which performs a second spatial transformation having less fine pitch, with pitches between the contact pads of a last interface layer with the PCB board that reach up to about 400 µm, corresponding to the pitch between the contact pads of the PCB board, indeed.

In FIG. 1 a probe card 1 is schematically illustrated, comprising a probe head 10 having vertical probes, comprising at least one upper plate or guide 11 and one lower plate or guide 12, having respective upper and lower guide holes within which a plurality of contact probes 14 slide. Each contact probe 14 has at least one contact end or tip which abuts onto contact pad of a device under test 15, establishing the mechanical and electric contact between said device and a testing apparatus (not shown) which such probe head 10 form an end element of.

An interposer 20 is also provided, which performs a spatial transformation between contact pads 20A arranged on a first face Fa thereof facing the probe head 10, the pitch between the contact pads 20A being equal to that between contact pads 15A of the device under test 15, and contact pads 20B arranged on a second and opposite face Fb facing a PCB board 25, the pitch between the contact pads 20B corresponding to that between contact pads 25A of the PCB board 25.

According to the prior art, the most common technique for manufacturing such interposer 20 is the photolithographic technique. This technique usually includes a manufacturing process of the sequential type, wherein each layer, once it has been processed and completed, forms the base for a subsequent layer to be processed, process also named "build-up sequence".

Such technique comprises a first arrangement phase of a first dielectric layer, on which holes are formed, for example by laser perforation.

Subsequently, a metal film, for example made of palladium, having a few hundred angstroms thickness, is deposited on the first dielectric layer, for example by dipping the dielectric layer in the liquid metal.

Subsequently, a film made of a photosensitive resin or dry resist is entirely deposited on the metal film. Such photosensitive resin or resist film is processed in order to form a mask for the underlying first dielectric layer. In particular, a transparent mask, for example made of glass, is arranged on the resist film, which mask, when exposed to ultraviolet radiation, projects on the resist film a pattern corresponding to the desired conductive tracks in the underlying first dielectric layer.

The technique further comprises a chemical treatment step, in particular chemical etching, which removes unexposed portions of the resist film.

After exposure to ultraviolet radiation and subsequent chemical etching of the resist film, a resist mask is obtained which leaves the underlying metallic film exposed only at the zones wherein a conductive material is supposed to form, such as copper, which forms the conductive tracks, thus creating a masked film.

The conductive material is thus formed on such masked film, which is subsequently removed also by chemical etching.

The technique thus provides a final step of removing the remaining metal film by selective chemical etching, so as not to damage the conductive material that has been previously formed to form the conductive tracks.

Only at this stage the technique provides to start over with the same sequence of steps starting from a second dielectric layer arranged on the first layer already "finalized".

Usually, this technique is employed for the manufacture of the noble zone, wherein the thickness of each dielectric layer and the pitch between the contact pads requires manufacturing techniques having "fine pitch".

In that case, the dielectric layer is preferably made of organic material, since the processing of thinner layers is easier and the removing processes of the resist film are very fast.

Even if advantageous in many ways, this first technique has several drawbacks, including the need to deposit a resist film and to use a mask. As a consequence, the manufacture of the interposer is laborious and extremely expensive, mainly suitable for mass production, but very disadvantageous in case of a highly specialized production such as that of probe cards.

Alternatively, to the photolithographic technique, a manufacturing process of the sequential type of the type specified above may comprise a "laser direct imaging" step (LDI), wherein the deposit of a resist film on each dielectric layer is however provided, but instead of applying a glass mask on the resist film, a focused laser beam directly illuminates such resist film. In particular, the focused laser beam is moved on the surface of the resist film and is alternately turned on and off according to a pattern corresponding to the desired conductive tracks, thus obtaining, thanks to the formation of a suitable conductive material, a masked film.

Although it meets the objective, even this alternative technique is not drawback-free since it also provides for the deposition and processing of a resist film in order to obtain a masked film; it is therefore difficult and expensive, a few producers being furthermore equipped to implementing it.

Unlike the noble zone, the core zone layers can instead be formed in parallel and superimposed at the end of the processing procedure thereof, thus forming a multi-layer solely for the core area. There are several solutions for manufacturing such core zone.

In a first solution, the core zone is manufactured by means of a subtractive technique, wherein a plurality of dielectric layers and a conductive material which completely covers each dielectric layer are arranged, such dielectric layer being made in particular of organic material. The conductive material is subsequently subtracted to form the conductive tracks where desired.

Alternatively, in a second solution, the core zone is manufactured by processing thin and soft ceramic layers wherein holes are formed by punching and a conductive paste is deposited by screen printing by means of suitable metal stencils, made for example of tungsten or copper. Only in the end, these thin and soft ceramic layers are superimposed on each other and therefore solidarized (namely physically connected) and hardened by cooking in a single multi-layered structure which forms the interposer.

Both these known solutions have the drawback of not allowing the formation of distances between the contact pads corresponding to the thinnest ones of the device under test, and for this reason they are used only for manufacturing the core zone, where the distance constraints between pads are more flexible.

US 2017/0019990, JP 2010 054323, and US 2009/0051041 disclose multilayer interposers having through holes filled with conductive material forming conductive paths between layers.

BRIEF SUMMARY

The manufacturing method of a multi-layer is capable of avoiding the expensive and complicated masking process that uses a resist film for manufacturing the noble zone, with obvious advantages in terms of production costs.

According to an aspect of the disclosure the laser ablation technique is used to form the conductive paths of a multi-layer of a probe card for a testing apparatus of electronic devices.

The manufacturing method of a multi-layer for a probe card, comprising the steps of:
providing a plurality of dielectric layers starting from a first dielectric layer to a last dielectric layer;
forming, by means of laser ablation, in each dielectric layer of the plurality of dielectric layers a plurality of pass-through structures whose amount is the same in each dielectric layer, the plurality of pass-through structures being adapted to connect opposite faces of each dielectric layer to each other;
filling the plurality of pass-through structures with a conductive material to form a plurality of conductive structures in each dielectric layer; and
superimposing the plurality of dielectric layers so that each conductive structure of the plurality of conductive structures of each dielectric layer contacts a corresponding conductive structure of the plurality of conductive structures of a subsequent and contiguous dielectric layer in such multi-layer and forms a plurality of conductive paths,
such conductive paths establishing an electrical connection between a first plurality of contact pads arranged on a first face of the multi-layer at an exposed face of the first dielectric layer, and a second plurality of contact pads arranged on a second and opposite face of the multi-layer at an exposed face of the last dielectric layer, the second plurality of contact pads having a greater pitch than the first plurality of contact pads, the multi-layer performing therefore a spatial transformation between the pluralities of contact pads connected by means of the conductive paths.

According to another aspect of the disclosure, the plurality of contact pads can be formed in surface conductive zones of the conductive structures at the exposed faces of the first and last dielectric layers.

Furthermore, according to another aspect of the disclosure, the step of forming in each dielectric layer the plurality of pass-through structures can comprise a step of forming at least one pass-through hole or via, the pass-through hole extending transversely and connecting opposite faces of a corresponding dielectric layer.

More particularly, the step of forming in each dielectric layer the plurality of pass-through structures can further comprise a step of forming at least one cavity or recess, such recess extending lengthwise starting from the pass-through hole on the surface of the dielectric layer.

According to this aspect of the disclosure, the step of forming the pass-through holes can result in pass-through holes having a progressively greater distance starting from the first dielectric layer towards the last dielectric layer, and the step of forming the recesses can result in respective recesses having a lengthwise extension equal to a distance between opposite walls of respective pass-through holes formed in subsequent and contiguous dielectric layers.

According to another aspect of the disclosure, the step of filling the pass-through structures can comprise a step of selectively depositing the conductive material on each dielectric layer, so as to fill only the pass-through structures and form the conductive structures.

In particular, the step of selectively depositing the conductive material can comprise a serigraphic process.

According to yet another aspect of the disclosure, the step of filling the pass-through structures can comprise a step of non-selective deposition of the conductive material over the entire surface of each dielectric layer and in the pass-through structures, so as to form the conductive structures and a surface conductive layer on a surface of each dielectric layer.

In that case, the manufacturing method can further include a step of removing by lapping the surface conductive layer formed by the conductive material on the surface of each dielectric layer.

According to another aspect of the disclosure, the manufacturing method can further comprise a final step of joining the plurality of superimposed dielectric layers.

Furthermore, each dielectric layer of the plurality of dielectric layers can be made of an inorganic material and the inorganic material can be selected among a ceramic material, preferably silicon nitride, a glass or a ceramic glass.

The problem is also solved by a multi-layer manufactured by the method described above, adapted to form a structure selected among a noble zone of an interposer of a probe card, a core zone of an interposer of a probe card, an interposer of a probe card.

Finally, the problem is solved by a multi-layer manufactured by the method described above, adapted to form a structure comprising a fine central core zone sandwiched between two noble zones having a finer pitch.

The features and advantages of the manufacturing method and of the multi-layer according to the disclosure will be apparent from the description made hereafter of an embodiment thereof, given by way of indicative and non-limiting example, with reference to the accompanying drawings.

BRIEF DESCRIPTION OF THE SEVERAL VIEWS OF THE DRAWINGS

FIG. 4A schematically shows a section view of a portion of the multi-layer of FIG. 3 in a first step of the method according to the present disclosure;

FIG. 4B schematically shows a section view of a portion of the multi-layer of FIG. 3 in a second step of the method according to the present disclosure;

FIG. 4C schematically shows a section view of a portion of the multi-layer of FIG. 3 in a third step of the method according to the present disclosure;

FIG. 4D schematically shows a section view of a portion of the multi-layer of FIG. 3 in a fourth step of the method according to the present disclosure;

DETAILED DESCRIPTION

Figure 1:
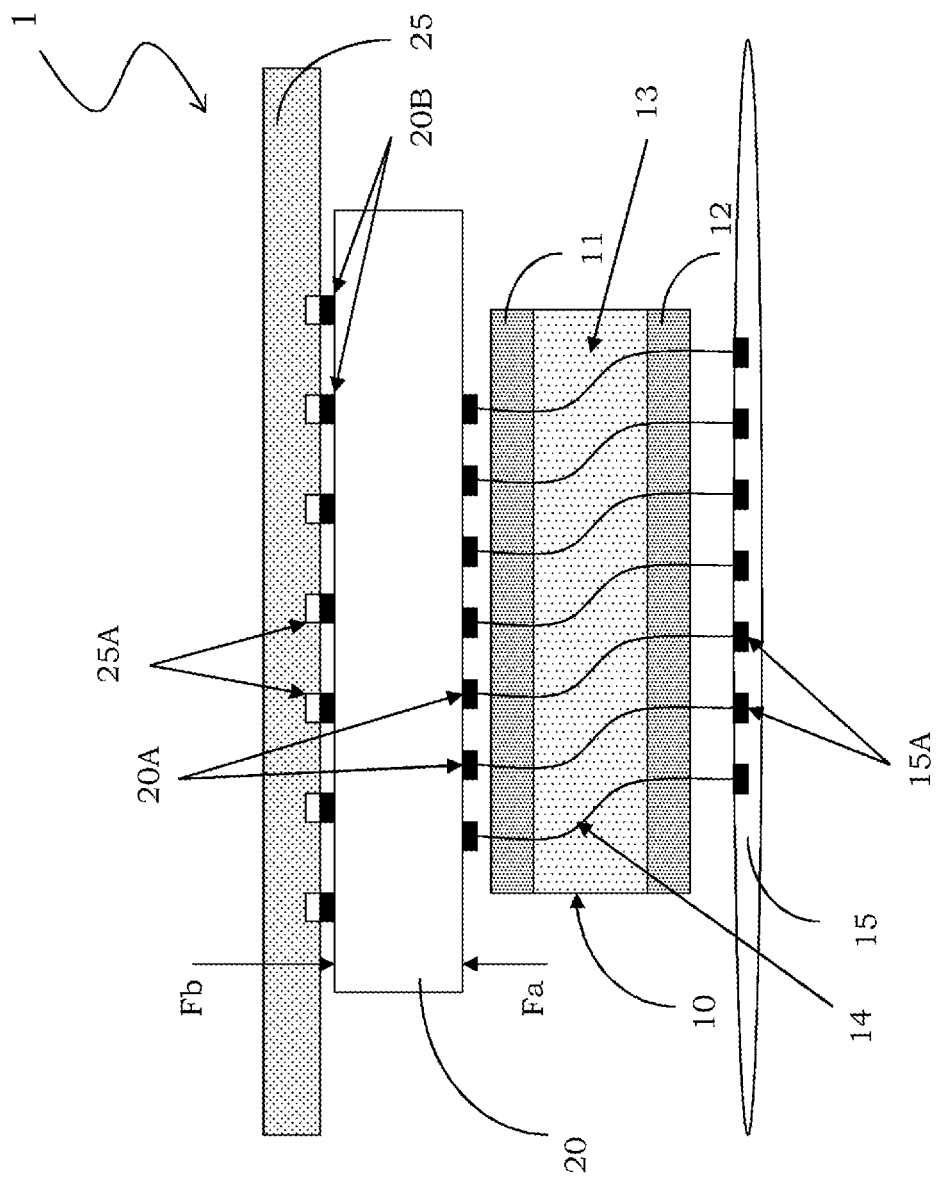
FIG. 1 schematically shows a probe card for a testing apparatus of electronic devices manufactured according to the prior art, wherein a probe head, an interposer and a PCB board are comprised.

With reference to these Figures, a method for producing a multi-layer is described, which can be used as interposer of a probe card for a testing apparatus of electronic devices, of the type globally indicated by 20 in FIG. 1.

It should be noted that the Figures represent schematic views and are not drawn to scale, but instead they are drawn so as to enhance the important features of the disclosure. Furthermore, in the Figures the different elements are schematically shown, since their shape can vary according to the desired application.

Figure 2:
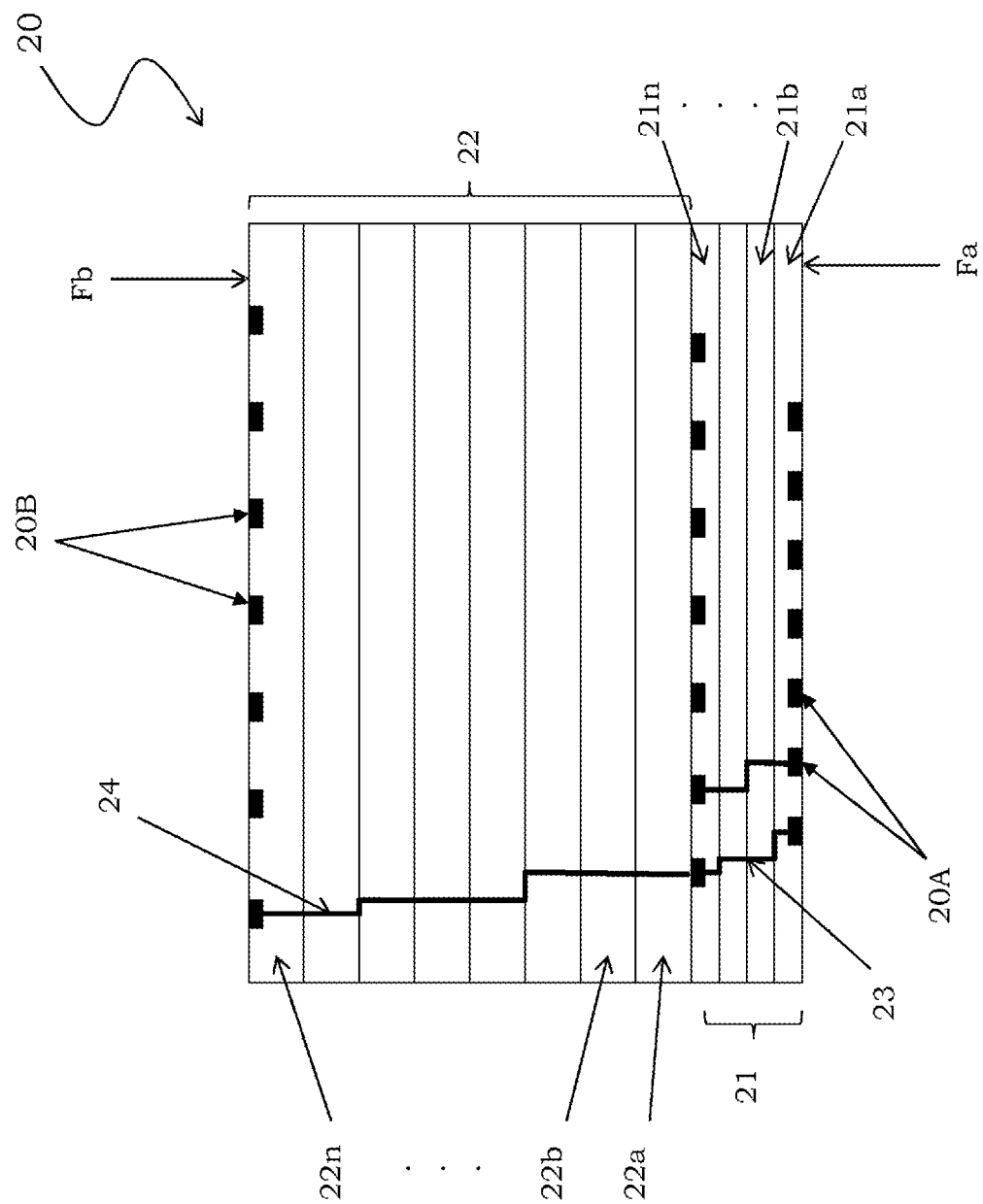
FIG. 2 schematically shows the interposer of FIG. 1, wherein a noble zone and a core zone are comprised, which can be manufactured by the method according to the present disclosure.

As shown in FIG. 2, an interposer of a probe card, still globally indicated by 20, generally comprises a plurality of layers 21a-21n, 22a-22n, superimposed on each other to perform the desired spatial transformation of the distances between pluralities of contact pads arranged on opposed faces Fa and Fb thereof, as described in connection with the prior art.

In particular, the interposer 20 comprises a first plurality of contact pads 20A arranged on a first face Fa thereof, facing a probe head (not shown in FIG. 2), and having a distance equal to that between contact pads of a device under test (also not shown in FIG. 2), as well as a second plurality of contact pads 20B arranged on a second and opposite face Fb thereof, having a greater distance than the first plurality of contact pads 20A and in particular analogous to the distance between contact pads being on a PCB board for the connection with a testing apparatus, as explained in connection with the prior art.

As previously indicated, "distance between contact pads" means a distance between respective centres of symmetry of such contact pads, commonly referred to as "pitch".

Within the interposer 20 suitable conductive paths 24 are also provided to perform the routing between the first plurality of contact pads 20A and the second plurality of contact pads 20B.

In particular, the contact pads of the first plurality of contact pads 20A usually have a distance of 60-80 μm, that is to say equal to the usual pitch values for contact pads of the devices under test integrated on a wafer, while the contact pads of the second plurality of contact pads 20B usually have a distance of about 400 μm, that is to say equal to the usual pitch values for contact pads of PCB boards interfacing with testing apparatus.

More particularly, the interposer 20 is divided into a noble zone 21 and a core zone 22. The noble zone 21 comprises a first plurality of dielectric layers 21a-21n, usually of equal thickness, superimposed and in contact with each other, which performs a first spatial transformation having fine pitch, with distances between contact pads ranging for example from 60-80 μm for a first dielectric layer 21a up to about 200 μm for a last dielectric layer 21n. The core zone 22 likewise comprises a second plurality of dielectric layers 22a-22n, having greater thickness (usually equal to each other) and whose amount is greater with respect to the layers of the noble zone; the layers of such second plurality of dielectric layers 22a-22n are superimposed and in contact with each other, so as to perform, similarly to the noble zone 21, a second spatial transformation having less fine pitch, with pitches between contact pads ranging for example from about 200 μm for a first dielectric layer 22a up to about 400 μm for a last dielectric layer 22n.

The plurality of contact pads 20A and 20B are electrically connected thanks to conductive paths 23 formed in the noble zone 21 and to conductive paths 24 formed in the core zone 22, as will be explained more in detail below.

A method will be described in detail below, for manufacturing a multi-layer, which can form both the noble zone 21 and the core zone 22 of the interposer 20 of FIG. 2. This method according to the disclosure will be described with reference to a generic multi-layer, globally indicated by 30 in FIG. 3.

With reference to such Figure, the multi-layer 30 is divided into a plurality of dielectric layers 30a-30n, starting from a first dielectric layer 30a up to a last dielectric layer 30n, which perform a spatial transformation between a first plurality of contact pads 30A being on a first face F1 thereof, at the first dielectric layer 30a, and a second plurality of contact pads 30B being on a second and opposite face F2 thereof, at the last dielectric layer 30n. In particular, the contact pads of the second plurality of contact pads 30B have a distance between the centres thereof, namely the so-called pitch, greater than the distance between the centres of the contact pads of the first plurality of contact pads 30A. Within the multi-layer 30 suitable conductive paths 36 are also provided to perform the routing between the first plurality of contact pads 30A and the second plurality of contact pads 30B.

Substantially, the face F1 and the face F2 correspond to respective opposite faces of the multi-layer 30 and such multi-layer performs a spatial transformation between the plurality of contact pads 30A and 30B arranged thereon, suitably connected by the conductive paths 36.

The amount and the thickness of the dielectric layers of the plurality of dielectric layers 30a-30n can vary depending on the desired spatial transformation. For example, if the multi-layer 30 is adapted to form the noble zone 21, the dielectric layers can be selected so as to have a reduced thickness and in a smaller amount than if the multi-layer 30 is adapted to form the core zone 22.

It is underlined that the thickness of the dielectric layers of the multi-layer 30 may possibly vary also within the noble zone 21 or the core zone 22 according to the need and/or circumstances.

With particular reference to FIGS. 4A to 4D, it is now described the manufacturing method of the multi-layer 30 which comprises, suitably according to the disclosure, the steps of:

providing a plurality of dielectric layers 30a-30n starting from a first dielectric layer 30a to a last dielectric layer 30n;

forming, by means of laser ablation, in each dielectric layer of this plurality of dielectric layers 30a-30n a plurality of pass-through structures whose amount is the same in each dielectric layer 30a-30n, such plurality of pass-through structures being adapted to connect opposite faces of each dielectric layer to each other;

filling such plurality of pass-through structures by means of a conductive material to form a plurality of conductive structures in each dielectric layer; and superimposing such plurality of dielectric layers 30a-30n so that each conductive structure of the plurality of conductive structures of each dielectric layer contacts a corresponding conductive structure of the plurality of conductive structures of a subsequent and contiguous dielectric layer in such multi-layer 30 and thus forms a plurality of conductive paths 36.

In this way, the conductive paths 36 establish an electrical connection between a first plurality of contact pads 30A arranged on a first face F1 of the multi-layer 30, at an exposed face of the first dielectric layer 30a, and a second plurality of contact pads 30B arranged on a second and opposite face F2 of the multi-layer 30, at an exposed face of the last dielectric layer 30n.

The expression "exposed face" refers hereinafter to that face of a dielectric layer of the multi-layer 30 which does not contact any other dielectric layer of the plurality of dielectric layers 30a-30n of the multi-layer 30.

Suitably, the second plurality of contact pads 30B has a different distance, in particular a greater distance, of its centres of symmetry with respect to the first plurality of contact pads 30A, the multi-layer 30 thus performing a spatial transformation between the pluralities of contact pads 30A and 30B connected by the conductive paths 36.

As previously stated, hereinafter, for the sake of simplicity of exposure, we will talk about the distance between contact pads, meaning the distance between the respective centres of symmetry, that is to say the so-called pitch.

Suitably, the method according to the present disclosure can be used interchangeably both for manufacturing the noble zone 21 and for manufacturing the core zone 22, as described with reference to the interposer 20 illustrated in FIG. 2. Alternatively, such method can be used only for the manufacture of the noble zone 21, while the core zone 22, wherein the distance constraints between the contact pads are looser, can be manufactured by known methods and subsequently solidarized to the noble zone 21.

Furthermore, the method comprises a final step wherein all the dielectric layers that form the multi-layer 30 are provided with conductive structures and superimposed so as to form conductive paths 36 between the plurality of contact pads 30A of the first dielectric layer 30a and the plurality of contact pads 30B of the last dielectric layer 30n, such dielectric layers being finally solidarized (namely physically connected).

Each dielectric layer of the multi-layer 30 is preferably made of an inorganic material, the laser processing of the surface thereof being easier. In particular, such inorganic material is selected among a ceramic material, such as $Si_3N_4$ silicon nitride, a glass or a ceramic glass.

For the sake of simplicity and not to overload the following description, in FIGS. 4A-4D only a portion of the multi-layer 30 is shown, comprising a first dielectric layer 30a and a second dielectric layer 30b, subsequent and contiguous to the first dielectric layer 30a, of the plurality of dielectric layers 30a-30n which realise the multi-layer 30, the subsequent dielectric layers can be formed using the described steps, even all parallel to each other, these Figures being provided only by way of non-limiting example.

As shown in FIG. 4A, the manufacturing method of the multi-layer 30 starts with the step of arranging the dielectric layers 30a, 30b for the following processing.

Subsequently, as shown in FIG. 4B, the method comprises the step of forming, in each dielectric layer of such plurality of dielectric layers 30a, 30b, a plurality of pass-through structures, respectively indicated by 31a for the first dielectric layer 30a and by 31b for the second dielectric layer 30b, such pass-through structures being in the same amount in each dielectric layer.

Suitably, these pluralities of pass-through structures 31a, 31b are obtained by laser ablation, that is by selective removal of portions of the relative dielectric layer by means of a suitably focused laser beam.

It should be noted that, although the method described in FIGS. 4A-4D forms on each dielectric layer only two pass-through structures, such configuration does not in any way limit the scope of the disclosure, but is provided only by way of example, since any number of pass-through structures can be provided on each dielectric layer. It is also underlined that the positioning of such pass-through structures 31a, 31b in the respective dielectric layers 30a, 30b is free and tied only to the relative positioning of such pass-through structures and to possible further components to be placed in the dielectric layers 30a, 30b.

In particular, suitably according to the disclosure, the step of forming in each dielectric layer the plurality of pass-through structures 31a, 31b by laser ablation comprises a step of forming at least one pass-through hole or via, such pass-through hole connecting the opposite faces of each dielectric layer.

Furthermore, the step of forming in each dielectric layer the plurality of pass-through structures 31a, 31b by laser ablation comprises a step of forming at least one cavity or recess, such recess extending lengthwise on the surface of the dielectric layer starting from a pass-through hole formed therein. Obviously in certain configurations the pass-through structures 31a, 31b can comprise only a pass-through hole adapted to connect the opposite faces of a corresponding dielectric layer, without providing also a respective recess.

More particularly, as illustrated in FIG. 4B, each pass-through structure of the plurality of pass-through structures 31a of the first dielectric layer 30a comprises pass-through holes 32a and recesses 33a, while each pass-through structure of the plurality of pass-through structures 31b of the second dielectric layer 30b comprises pass-through holes 32b and recesses 33b.

Figure 5:
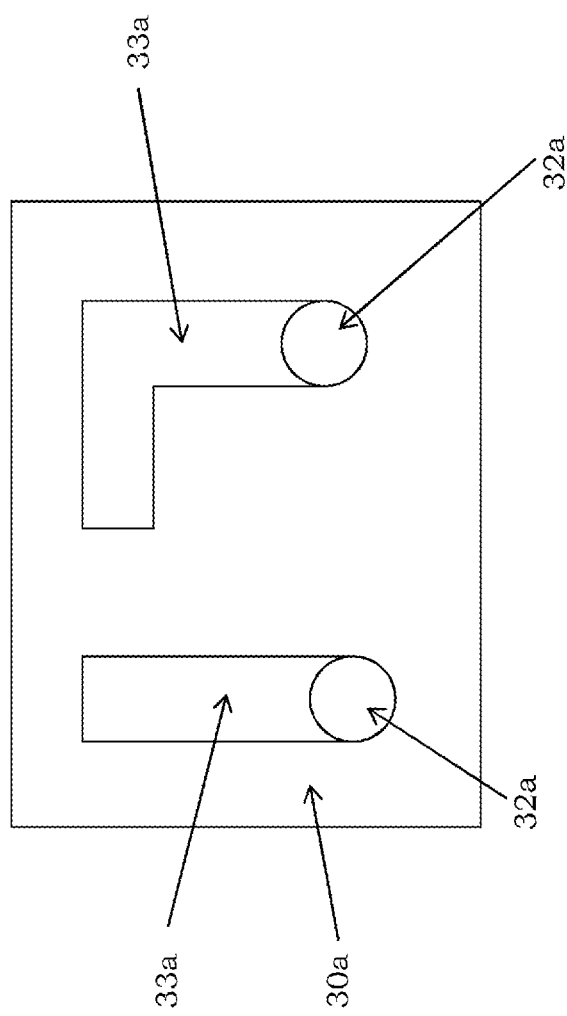
FIG. 5 shows a schematic top view of a single dielectric layer of the multi-layer of FIG. 3 formed by the method described in FIGS. 4A-4D.

Suitably, the pass-through holes 32a, 32b have a transverse extension in the respective dielectric layer 30a, 30b, namely in a vertical direction considered the local reference of the Figures, greater than that of the recesses 33a, 33b, crossing the whole thickness of the dielectric layer and allowing the connection between the opposite faces of each dielectric layer. Alternatively, the recesses 33a, 33b have a lengthwise extension in the respective dielectric layer 30a, 30b, namely in a horizontal direction considered the local reference of the Figures, greater than that of the pass-through holes 32a, 32b, allowing the formation of conductive tracks on the surface of each dielectric layer, as clear in FIG. 5 which shows, by way of example, a schematic top view of the first dielectric layer 30a following the formation process of the pass-through structures 31a, 31b by laser ablation.

The reversed-L shape of the pass-through structures 31a, 31b of the dielectric layers 30a, 30b illustrated in FIG. 4B also allows to form the pass-through holes 32b of the second dielectric layer 30b at a greater distance with respect to the pass-through holes 32a of the first dielectric layer 30a, which will be suitably arranged closer to a probe head than the second dielectric layer 30b, in case the multi-layer 30 comprising it forms an interposer, as will be further clarified in the following description.

It should be pointed out that the method illustrated in the present detailed description allows to form in each dielectric layer of the multi-layer 30 pass-through structures wherein the pass-through holes and the recesses are both formed by laser ablation, without the need to deposit a resist film on the surface of each dielectric layer, as instead required in the known methods.

With reference to FIG. 4C, the manufacturing method of the multi-layer 30 further comprises the step of filling such plurality of pass-through structures 31a, 31b, formed in each dielectric layer 30a, 30b, with a conductive material, preferably copper, thus obtaining a plurality of conductive structures, indicated respectively by 34a for the first dielectric layer 30a and by 34b for the second dielectric layer 30b.

Such plurality of conductive structures 34a, 34b have respective pluralities of surface conductive zones 35a and 35b, at exposed horizontal faces (considered the local reference of FIG. 4C) of the first dielectric layer 30a and the second dielectric layer 30b, respectively, and respective pluralities of surface conductive zones 35a' and 35b', at contacting horizontal faces (again considered the local reference of FIG. 4C) of the first dielectric layer 30a and the second dielectric layer 30b, respectively; in this way, the conductive structures 34a, 34b can ensure the effective electrical contact between two subsequent and contiguous dielectric layers, such as the dielectric layers 30a and 30b of FIGS. 4A-4D, suitably superimposed so that the surface conductive zones 35a' and 35b' of the pluralities of conductive structures 31a, 31b formed in the dielectric layers 30a, 30b are in contact with each other at respective faces of such dielectric layers, also in contact with each other.

As clear in FIG. 4C, such conductive structures 34a, 34b, thanks to the reversed-L shape given by the combination of pass-through holes and recesses, form a distance between the surface conductive zones, respectively 35a and 35a', 35b and 35b', formed in each layer as well as a distance between the surface conductive zones 35a and 35b formed at exposed faces of the dielectric layers 30a, 30b, in particular an increase in the distance of the symmetry centres thereof.

This progressive distance is in particular obtained by forming in each dielectric layer pass-through holes 32a and 32b having progressively greater distance starting from the first dielectric layer 30a gradually towards the last dielectric layer 30n and recesses 33a, 33b having a lengthwise extension equal to a distance DF between opposite walls of respective pass-through holes 32a, 32b formed in the first and second dielectric layers 30a, 30b, as indicated in FIG. 4C.

More particularly, as indicated in FIG. 4C, the first dielectric layer 30a has a distance D1 between the centres of the surface conductive zones 35a arranged on the exposed face thereof, namely the upper face using the local reference of the Figure, and a distance D2 between the surface conductive zones 35a' arranged on the lower face thereof (again using the local reference of the Figure), greater than the distance D1 (D2>D1); the first dielectric layer 30a is then put into contact to the second subsequent and contiguous dielectric layer 30b, which has a distance D3 between the surface conductive zones 35b arranged on the exposed face thereof, namely the lower face, always using the local reference of the Figure, greater than the distance D1 and the distance D2 (D3>D2>D1). The position and sizing of the conductive structures 34a, 34b of the first and second dielectric layer 30a, 30b is such that when such dielectric layers contact each other, even at least one portion of the respective conductive structures is in contact.

Taking into account a multi-layer comprising only the first dielectric layer 30a and the second dielectric layer 30b, it is possible to form a first plurality of contact pads 36A at the surface conductive zones 35a defined at the exposed face of the first dielectric layer 30a and a second plurality of contact pads 36B at the surface conductive zones 35b defined at the exposed face of the second dielectric layer 30b, the multi-layer so formed performing a spatial transformation between such respective pluralities of contact pads 36A and 36B, in particular with an increase in the distance between their centres of symmetry or pitches starting from the first dielectric layer 30a towards the second dielectric layer 30b.

Finally, as shown in FIG. 4D, the manufacturing process of the multi-layer 30 ends with the step of superimposing the dielectric layers 30a and 30b such that the plurality of conductive structures 34a of the first dielectric layer 30a contacts the corresponding plurality of conductive structures 34b of the second dielectric layer 30b, subsequent and contiguous, forming conductive paths 36.

The step of superimposing the dielectric layers 30a-30n further comprises a step of solidarization (namely of physical connection or union) of the single dielectric layers.

In a first embodiment of the present disclosure, as schematically indicated in FIG. 4C, the step of filling the pluralities of pass-through structures 31a, 31b comprises a step of selectively depositing the conductive material on each dielectric layer 30a, 30b so as to fill only the pass-through structures 31a, 31b and form the conductive structures 34a, 34b, in particular by a serigraphic process, namely distributing the conductive material through the openings of metal stencil applied onto each dielectric layer 30a, 30b so as to form the conductive structures 34a, 34b. The serigraphic process can employ for example a conductive paste.

Alternatively, according to another embodiment of the present disclosure represented in FIGS. 6A to 6D, the method comprises the initial step of providing the dielectric layers 30a, 30b per the subsequent processing.

Figure 6A:
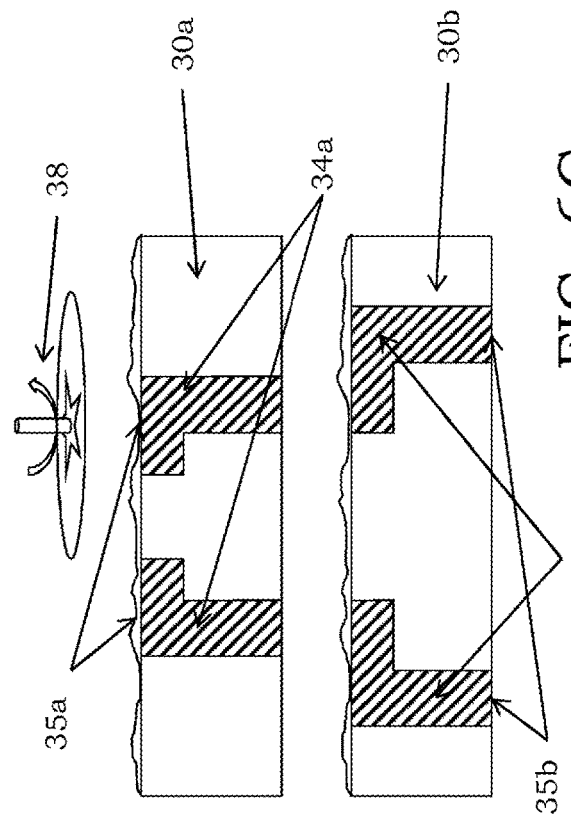
FIGS. 6A-6D schematically show the steps of a method for producing the multi-layer of FIG. 3 according to a second embodiment of the present disclosure.

Subsequently, as schematically illustrated in FIG. 6A, the method comprises the step of forming in each dielectric layer of such plurality of dielectric layers 30a, 30b, a plurality of pass-through structures 31a, 31b, in the same amount in each dielectric layer 30a, 30b.

Figure 6C:
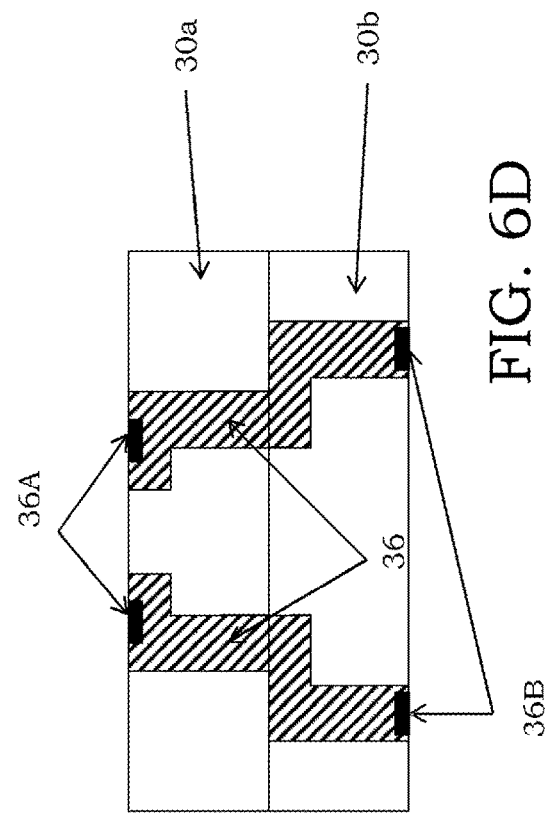
Figure 6B:
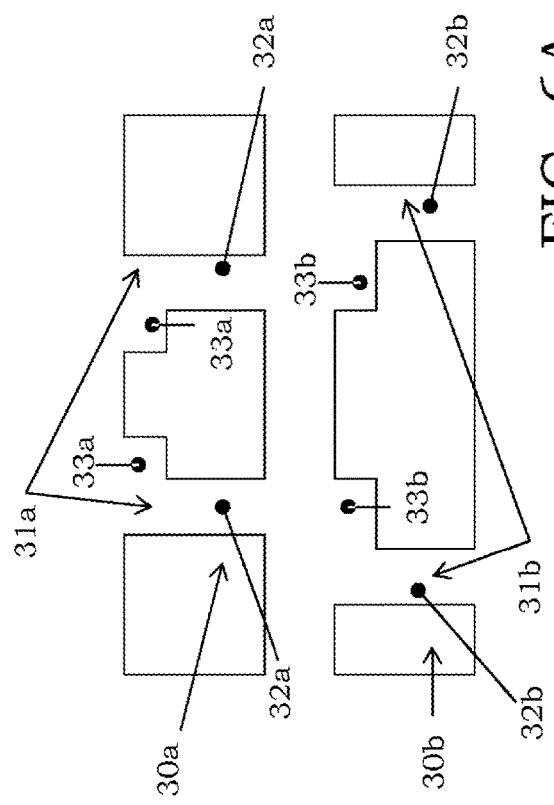
Figure 6D:
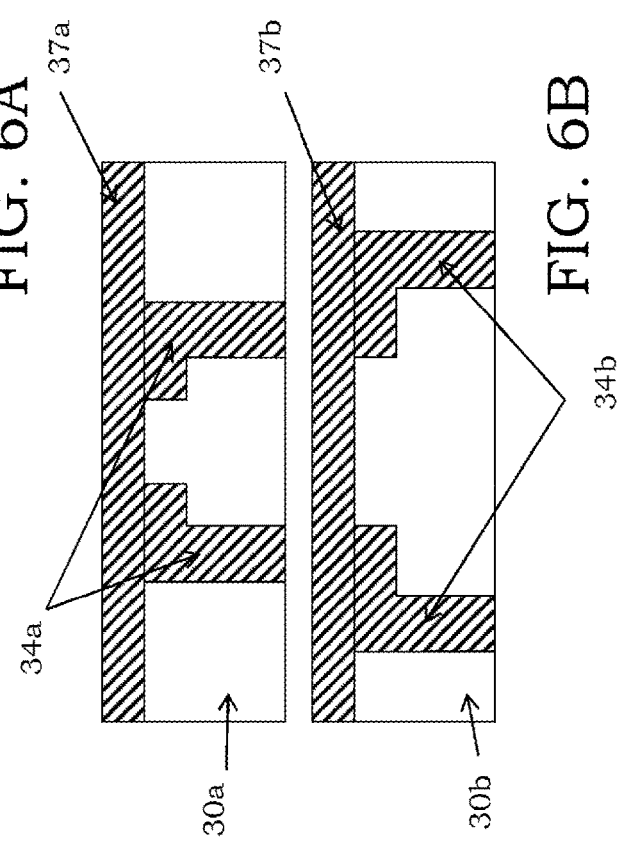

Furthermore, once the step of forming the pluralities of pass-through structures 31a, 31b has been completed, the step of filling such pluralities of pass-through structures 31a, 31b comprises a step of non-selective deposition of the conductive material over the entire surface of each dielectric layer 30a, 30b and in the pass-through structures 31a, 31b, and not only in the pass-through holes 32a, 32b and in the recesses 33a, 33b, as illustrated in particular in FIG. 6B. In that way, the conductive material forms the conductive structures 34a, 34b within the respective dielectric layers 30a, 30b as well as respective surface conductive layers, indicated by 37a and 37b, on a surface of each dielectric layer 30a, 30b.

Subsequently, the method according to this second embodiment further comprises the step of removing by lapping the surface conductive layers 37a, 37b formed by the conductive material on the surface of each dielectric layer, as schematically illustrated in FIG. 6C, for example by means of a lapping machine 38 which reduces the roughness of each dielectric layer 30a, 30b after removing the surface conductive layers 37a, 37b.

Figure 3:
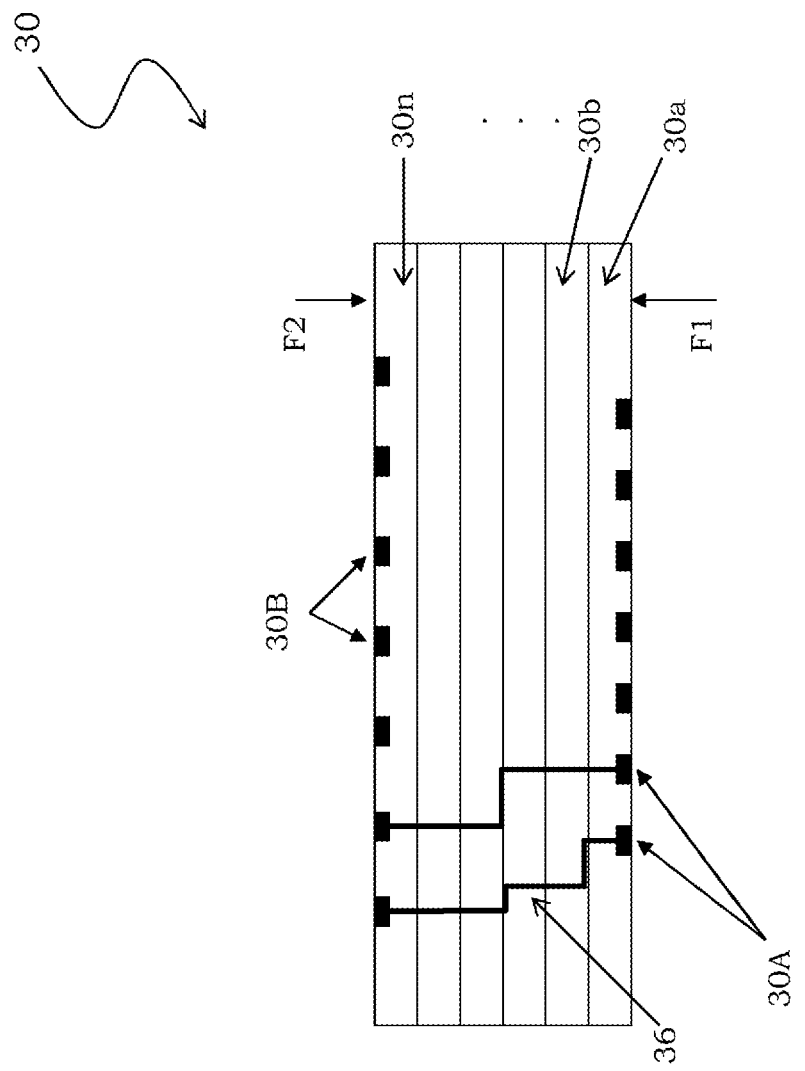
FIG. 3 schematically shows a multi-layer, which can be used as the interposer of FIG. 2, with particular reference to the noble zone, which can be manufactured by the method according to the present disclosure.

More generally, with reference to FIG. 3 for example, the conductive paths 3 establish an electrical connection between the first plurality of contact pads 30A, arranged on the first face F1 of the multi-layer 30 at an exposed face of the first dielectric layer 30a, and the second plurality of contact pads 30B, arranged on the second and opposite face F2 of the multi-layer 30 at an exposed face of the last dielectric layer 30n, this second plurality of contact pads 30B having a greater pitch than the first plurality of contact pads 30A, such multi-layer thus performing a spatial transformation between said pluralities of contact pads 30A, 30B.

It should be noted that the pluralities of contact pads 30A, 30B of the multi-layer 30 of FIG. 3 can be formed by surface conductive zones of the conductive structures 34a, 34b formed in each dielectric layer, in particular at the surface conductive zones arranged on the exposed faces of the first and the last dielectric layers 30a, 30n, namely at the faces F1 and F2 of the multi-layer 30 itself. More particularly, according to an embodiment of the disclosure, the contact pads 30A and 30B are formed by a portion of such surface conductive zones 35a, 35b of the conductive structures 31a, 31b formed in each dielectric layer; alternatively, the entire surface conductive zones 35a, 35b of the conductive structures 31a, 31b may form such contact pads 30A, 30B.

In this way it is possible to use the multi-layer 30 as an interposer, namely a structure capable of providing a desired spatial transformation between contact pads arranged on opposite faces thereof. More in particular, such an interposer has the first dielectric layer 30a in proximity to a contact head, with contact pads 30A formed at the surface conductive zones 35a and having a distance D1 substantially corresponding to a distance or pitch between the contact pads of the device under test integrated on a wafer, as well as the second dielectric layer 30b superimposed on such first dielectric layer 30a in the direction of a PCB board. If the second dielectric layer 30b were a last dielectric layer of such an interposer, it would also comprise contact pads 30B formed at the surface conductive zones 35b and having a distance D3 greater than the distance D1 and in particular substantially corresponding to a distance or pitch between contact pads of the PCB board.

In conclusion, the method according to the disclosure replaces the photolithographic and LDI techniques and allows the manufacture of the multi-layer 30 of a probe card 1 for a testing apparatus of electronic devices, performing by suitable conductive paths 36 the spatial transformation between a first plurality of contact pads 30A on a first face F1, facing the probe head of the card and a second plurality of contact pads 30B on a second and opposite face F2 thereof, facing the PCB board and having a distance greater than the first plurality of contact pads 30A.

Suitably according to the disclosure, the described method allows to manufacture, by using a same technique, both the noble zone 21 and the core zone 22, with the advantage of having a great precision in the formation of the conductive paths in both zones.

Alternatively, such method can be used only to manufacture the noble zone 21, which performs a spatial transformation having fine pitch and wherein the thickness of each dielectric layer and the distance between the contact pads involve the use of fine manufacturing techniques; the core zone 22 can instead be manufactured by known processes and subsequently solidarized to the noble zone 21, thus obtaining the desired interposer 20. Suitably, this also allows to select a material constituting the layers of the core zone 22 different from the material constituting the layers of the noble zone 21. It is in fact known that inorganic materials formed using MLC ceramic-based technology have a coefficient of thermal expansion (CTE) around $3\text{-}8\times10^{-6\circ}$ C.$^{-1}$, while organic materials formed using MLO organic-based technology have CTE up to $13\text{-}14\times10^{-6\circ}$ C.$^{-1}$, therefore very close to the typical CTE of the most common PCB boards, generally higher than $10\times10^{-6\circ}$ C.$^{-1}$.

In a particularly preferred embodiment, the method described above is used to manufacture the noble zone 21. The core zone 22 is instead manufactured by known processes, for example by means of a MLO organic-based technology, and subsequently solidarized to the noble zone 21, thus selecting for the core zone 22 a material with CTE comparable to that of the PCB board, so as to have an overall CTE of the interposer 20 capable of limiting the most the dimensional variations of the elements constituting the probe card during the test phase, thus making it usable even at high temperatures and also facilitating the welding between the multi-layer and the PCB board of the probe card.

In an alternative embodiment not shown in the Figures, the method according to the present disclosure can be used to form a multi-layer comprising a central core zone sandwiched between two noble zones having a finer pitch.

Suitably, the method according to the disclosure allows the parallel formation of the plurality of dielectric layers constituting the multi-layer, without the need of a manufacturing process of the sequential type, wherein each layer, once it has been processed and completed, forms the base for a subsequent layer to be processed.

In particular, the multi-layer thus formed and subdivided into a plurality of dielectric layers, can suitably perform a spatial transformation between a first plurality of contact pads on a first face thereof, at a first dielectric layer, and a second plurality of contact pads on a second and opposite face thereof, at a last dielectric layer, the pads of the second plurality of contact pads having a distance between their centres, namely the so-called pitch, greater than the distance between the centres of the pads of the first plurality of contact pads and being connected by suitable conductive paths which perform the routing thereof.

In particular, the multi-layer can form an interposer of a probe card, the first plurality of contact pads being in this case arranged on a first face, facing a probe head, and having a distance equal to that between the contact pads of a device under test, while the second plurality of contact pads is arranged on a second and opposite face and it has a greater distance with respect to the first plurality of contact pads and in particular analogous to the distance between contact pads on a PCB board for the connection with a testing apparatus.

It is also possible to form the conductive paths 36 in the multi-layer 30 such that two or more contact pads of the plurality of contact pads 30A arranged on the first face F1 of the multi-layer 30 contact a same contact pad of the plurality of contact pads 30B arranged on the second and opposite face F2 of the multi-layer 30, at an exposed face of the last dielectric layer 30n, thus connecting one to many pads. In this way it is possible to reduce the total amount of pads of the plurality of contact pads 30B arranged on the face F2.

Suitably according to the disclosure, the plurality of dielectric layers is superimposed such that each conductive structure of the plurality of conductive structures of each dielectric layer contacts a corresponding conductive structure of the plurality of conductive structures of a subsequent and contiguous dielectric layer in such multi-layer so as to form a plurality of conductive paths which establish an electrical connection between the pluralities of contact pads arranged on the opposed faces of the multi-layer.

Suitably, the amount and the thickness of the layers of the plurality of dielectric layers of the multi-layer can vary based upon the desired spatial transformation.

Suitably, the method according to the present disclosure can be employed for manufacturing the entire interposer or even only a portion thereof, for example the noble zone thereof where the distance constraints between the pads are more complicated.

Finally, suitably according to the disclosure, the described method allows to form on each dielectric layer of pass-through structures wherein the pass-through holes and the recesses are both formed by laser ablation, without the need to deposit a resist film on the surface of each dielectric layer, thus avoiding the use of masks, with a significant saving in terms of production costs.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A manufacturing method comprising:
    forming a multi-layer of an interposer of a probe card including:
        a plurality of dielectric layers;
        a first plurality of contact pads on a first face of the multi-layer in correspondence to an exposed first face of a first dielectric layer of the plurality of dielectric layers, the first plurality of contact pads having a first end that is coplanar with the first face of the first dielectric layer, and a second end opposite to the first end, the second end being within the first dielectric layer and spaced from a second face of the first dielectric layer that is opposite to the first face;
        a second plurality of contact pads on an opposite, second face of the multi-layer, in correspondence to an exposed first face of a last dielectric layer of the plurality of dielectric layers, the second plurality of contact pads having a first end that is coplanar with the exposed first face of the last dielectric layer, and a second end opposite to the first end, the second end being within the last dielectric layer and spaced from a second face of the last dielectric layer;

forming, by laser ablation, in each dielectric layer of the plurality of dielectric layers a plurality of pass-through structures that each extend completely through each dielectric layer of the plurality of dielectric layer;

forming a plurality of conductive structures by filling the plurality of pass-through structures with a conductive material; and forming a plurality of conductive paths by coupling the plurality of dielectric layers where each conductive structure of the plurality of conductive structures of each dielectric layer is in contact with a corresponding conductive structure of an adjacent one of the plurality of conductive structures of a subsequent and contiguous one of the plurality of dielectric layers, each conductive path of the plurality of conductive paths extending from a respective one of the first plurality of contact pads on the first face to a respective one of the second plurality of contact pads on the second face, the second plurality of contact pads having respective symmetry centers spaced apart by a greater distance than respective symmetry centers of the first plurality of contact pads, the multi-layer performing a spatial transformation between the first and second pluralities of contact pads connected through the connective paths, wherein the multi-layer is a structure having a noble zone and a core zone, the noble zone including a finer pitch of the plurality of conductive paths then the core zone, the noble zone having pitches from 60 μm to 200 μm, and the core zone having pitches from 200 μm to 400 μm, each layer in the plurality of dielectric layers in the noble zone having a first thickness and each layer in the plurality of dielectric layers in the core zone having a second thickness that is greater than the first thickness.

2. The manufacturing method of claim 1, wherein the first and second plurality of contact pads are realized in superficial connective zones of the conductive structures in correspondence of the exposed faces of the first and last dielectric layers.

3. The manufacturing method of claim 1, wherein forming each pass-through structure comprises forming at least one pass-through hole, transversally extending and connecting opposite faces of the dielectric layer.

4. The manufacturing method of claim 1, wherein forming each pass-through structure further comprises forming at least one recess, longitudinally extending starting from the pass-through hole at the surface of the dielectric layer.

5. The manufacturing method of claim 4, wherein the pass-through holes are formed to have a progressively greater distance starting from the first dielectric layer gradually towards the last dielectric layer and the recesses are formed to have longitudinal extension equal to a distance between opposed faces of corresponding pass-through holes realized in subsequent and continuous dielectric layers.

6. The manufacturing method of claim 1, wherein the pass-through structures are formed by the conductive material of the conductive structures.

7. The manufacturing method of claim 6, wherein the plurality of dielectric layers are realized by an inorganic material.

8. The manufacturing method of claim 7, wherein the inorganic material is chosen among a ceramic material, a glass or a ceramic glass.

9. The manufacturing method of claim 7, wherein the inorganic material is silicon nitride.

10. A manufacturing method, comprising:
forming a multi-layer for a probe card including:
a plurality of dielectric layers starting from a first dielectric layer to a last dielectric layer;
a first plurality of contact pads on a first face of the multi-layer in correspondence of an exposed face of the first dielectric layer;
a second plurality of contact pads on an opposite, second face of the multi-layer, in correspondence of an exposed face of the last dielectric layer;
forming, by laser ablation, in each dielectric layer of the plurality of dielectric layer a plurality of pass-through structures that each extend completely through each dielectric layer of the plurality of dielectric layers;
forming a plurality of conductive structures by filling the plurality of pass-through structures with a conductive material; and
forming a plurality of conductive paths by laying the plurality of dielectric layers onto one another with each conductive structure of the plurality of conductive structures of each dielectric layer is in contact with a corresponding conductive structure of one of the plurality of conductive structures of a subsequent and contiguous one of the dielectric layers;
each conductive path of the plurality of conductive paths extending from a respective one of the first plurality of contact pads on the first face to a respective one of the second plurality of contact pads on the second face, the second plurality of contact pads having respective symmetry centers spaced apart by a greater distance than respective symmetry centers of the first plurality of contact pads, the multi-layer performing a spatial transformation between the first and second pluralities of contact pads connected through the connective paths,
realizing in each dielectric layer the plurality of pass-through structures comprises:
forming, by laser ablation, at least one pass-through hole, transversally extending between and connecting opposite faces of a corresponding dielectric layer, and
forming, by laser ablation, at least one recess, longitudinally extending from the pass-through hole at the surface of the dielectric layer, the pass-through hole and the at least one recess forming a reverse L-shape having a right angle in the dielectric layer, wherein the multi-layer is includes a noble zone and a core zone, the noble zone having a first pitch between respective ones of the plurality of conductive paths, and the core zone having a second pitch between respective ones of the plurality of conductive paths, the first pitch of the noble zone being from 60 μm to 200 μm, and the second pitch from the core zone being from 200 μm to 400 μm, each layer in the plurality of dielectric layers in the noble zone having a first thickness and each layer in the plurality of dielectric layers in the core zone having a second thickness that is greater than the first thickness.

11. The manufacturing method of claim 10, wherein the first and second pluralities of contact pads are realized in superficial connective zones of the conductive structures in correspondence of the exposed faces of the first and last dielectric layers.

12. The manufacturing method of claim 10, wherein realizing the pass-through holes includes forming pass-through holes having a progressively greater distance starting from the first dielectric layer gradually towards the last dielectric layer and the step of realizing the recesses realizes corresponding recesses having longitudinal extension equal to a distance between opposed faces of corresponding pass-through holes realized in subsequent and continuous dielectric layers.

13. The manufacturing method of claim 10, wherein forming the plurality of conductive structures comprises a selective deposition of the conductive material on each dielectric layer only in the pass-through structures.

14. The manufacturing method of claim 13, wherein the selective deposition of the conductive material comprises a serigraphic process.

15. The manufacturing method of claim 10, wherein forming the plurality of conductive structures comprises a non-selective deposition of the conductive material on a whole surface of each dielectric layer and in the pass-through structures.

16. The manufacturing method of claim 15, further comprising removing by lapping the superficial conductive layer formed by the conductive material on the whole surface of each dielectric layer.

17. A method, comprising:
forming a plurality of first dielectric layers each having a first thickness;
forming a plurality of first contacts on a first side of the plurality of first dielectric layers, the plurality of first contacts having a first surface coplanar with the first side of the plurality of first dielectric layers;
forming a plurality of second contacts on a second side of the plurality of first dielectric layers, the plurality of second contacts having a first surface coplanar with the second side of the plurality of first dielectric layers;
forming a plurality of first conductive paths through each of the plurality of first dielectric layers, the plurality of first conductive paths being coupled between respective ones of the plurality of first contacts and the plurality of second contacts, each of the plurality of first conductive paths is spaced from an adjacent one of the plurality of first conductive paths by one of a plurality of first distances;
forming a plurality of second dielectric layers each having a second thickness that is greater than the first thickness;
forming a plurality of third contacts on a first side of the plurality of second dielectric layers, the plurality of third contacts having a first surface coplanar with the first side of the plurality of second dielectric layers;
forming a plurality of second conductive paths through each of the plurality of second dielectric layers, the plurality of second conductive paths being coupled between respective ones of the plurality of first contacts and the plurality of third contacts, each of the plurality of second conductive paths is spaced from an adjacent one of the plurality of second conductive paths by one of a plurality of second distances, each second distance being greater than each first distance.

18. The method of claim 17 wherein the plurality of first conductive paths have pitches from 60 μm to 200 μm, and the plurality of second conductive paths have pitches from 200 μm to 400 μm.

19. A multi-layer of an interposer of a probe card including:
a plurality of dielectric layers;
a first plurality of contact pads on a first face of the multi-layer in correspondence to an exposed first face of a first dielectric layer of the plurality of dielectric layers, the first plurality of contact pads having a first end that is coplanar with the first face of the first dielectric layer, and a second end opposite to the first end, the second end being within the first dielectric layer and spaced from a second face of the first dielectric layer that is opposite to the first face;
a second plurality of contact pads on an opposite, second face of the multi-layer, in correspondence to an exposed first face of a last dielectric layer of the plurality of dielectric layers, the second plurality of contact pads having a first end that is coplanar with the exposed first face of the last dielectric layer, and a second end opposite to the first end, the second end being within the last dielectric layer and spaced from a second face of the last dielectric layer;
a plurality of pass-through structures that each extend completely through each dielectric layer of the plurality of dielectric layers;
a plurality of conductive structures comprising the plurality of pass-through structures filled with a conductive material; and
a plurality of conductive paths between the plurality of dielectric layers, each conductive path of the plurality of conductive paths comprising a respective conductive structure of the plurality of conductive structures of each dielectric layer in contact with a corresponding conductive structure of an adjacent one of the plurality of conductive structures of a subsequent and contiguous one of the plurality of dielectric layers, each conductive path of the plurality of conductive paths extending from a respective one of the first plurality of contact pads on the first face to a respective one of the second plurality of contact pads on the second face, the second plurality of contact pads having respective symmetry centers spaced apart by a greater distance than respective symmetry centers of the first plurality of contact pads, the multi-layer performing a spatial transformation between the first and second pluralities of contact pads connected through the connective paths,
wherein the multi-layer is a structure having a noble zone and a core zone, the noble zone including a finer pitch of the plurality of conductive paths then the core zone, the noble zone having pitches from 60 μm to 200 μm, and the core zone having pitches from 200 μm to 400 μm, each layer in the plurality of dielectric layers in the noble zone having a first thickness and each layer in the plurality of dielectric layers in the core zone having a second thickness that is greater than the first thickness.

20. The multi-layer of claim 19 wherein a first outer one of pass-through holes has a first distance from an outer edge of the multi-layer structure, the first outer one being in the noble zone, a second outer one of the pass-through holes has a second distances from the outer edge of the multi-layer structure, the second outer one being in the core zone, the first distance being greater than the second distance.

* * * * *